United States Patent [19]
Miyazaki et al.

[11] Patent Number: 5,413,864
[45] Date of Patent: May 9, 1995

[54] LOW EMISSIVITY FILM

[75] Inventors: Masami Miyazaki; Eiichi Ando, both of Yokohama, Japan

[73] Assignee: Asahi Glass Company Ltd., Tokyo, Japan

[21] Appl. No.: 726,263

[22] Filed: Jul. 5, 1991

[30] Foreign Application Priority Data

Jul. 5, 1990 [JP] Japan .................. 2-176282
Nov. 27, 1990 [JP] Japan .................. 2-321273

[51] Int. Cl.6 .................. B32B 15/04; B32B 7/02
[52] U.S. Cl. .................. 428/432; 359/350; 359/360; 359/577; 359/580; 359/581; 359/582; 359/585; 359/586; 428/212; 428/426; 428/469; 428/472; 428/697; 428/699; 428/701; 428/702
[58] Field of Search .................. 428/212, 426, 432, 688, 428/689, 697, 699, 702, 433, 469, 472, 701; 359/350, 360, 577, 580, 581, 582, 585, 586

[56] References Cited

U.S. PATENT DOCUMENTS

| | | | |
|---|---|---|---|
| 3,978,272 | 8/1976 | Donley | 428/469 |
| 4,367,921 | 1/1983 | Sawamua et al. | 359/586 |
| 4,462,883 | 7/1984 | Hart | 204/192 C |
| 4,859,532 | 8/1989 | Oyama et al. | 428/469 |
| 4,894,290 | 1/1990 | Chesworth et al. | 428/426 |
| 4,902,081 | 2/1990 | Huffer | 359/360 |
| 4,943,484 | 7/1990 | Goodman | 428/426 |
| 4,965,121 | 10/1990 | Young et al. | 428/689 |
| 4,971,843 | 11/1990 | Michelotti et al. | 428/702 |
| 5,110,637 | 5/1992 | Ando et al. | 428/702 |

FOREIGN PATENT DOCUMENTS

0183052 10/1985 European Pat. Off. .
0332717 3/1988 European Pat. Off. .
2586245 8/1986 France .

OTHER PUBLICATIONS

World Patent Index Latest Accession No. 84-059802, week 10 Derwent Publications Ltd., London GB & JP-A-59 018 134 (Asahi Glass KK) Jan. 30, 1984.
World Patent Index Latest Accession No. 89-003563, week 01 Derwent Publications Ltd., London GB & JP-A-63 281 204 (Sharp KK) Nov. 17, 1988.
Cotton et al. "Advanced Inorganic Chemistry", 4th ed., Wiley, New York, 1980, p. 598.

*Primary Examiner*—A. A. Turner
*Attorney, Agent, or Firm*—Oblon, Spivak, McClelland, Maier & Neustadt

[57] ABSTRACT

A low emissivity film which comprises: a substrate; and a coating of oxide and metallic films alternately formed on the substrate in a total of (2n+1) layers where n is an integer being equal to or more than 1, with the innermost layer being an oxide film, wherein the oxide film (B) formed on the outer side of the metallic film (A) being most apart from the substrate, has an internal stress which is equal to, or less than $1.1 \times 10^{10}$ dyne/cm$^2$.

22 Claims, 1 Drawing Sheet

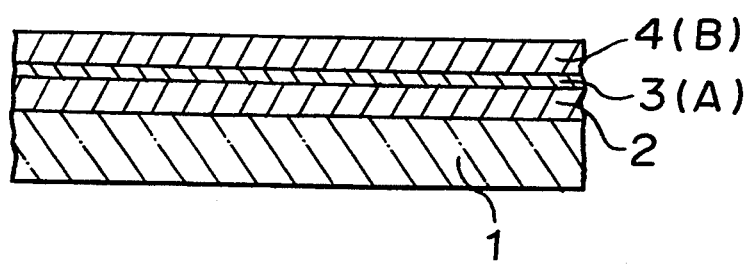
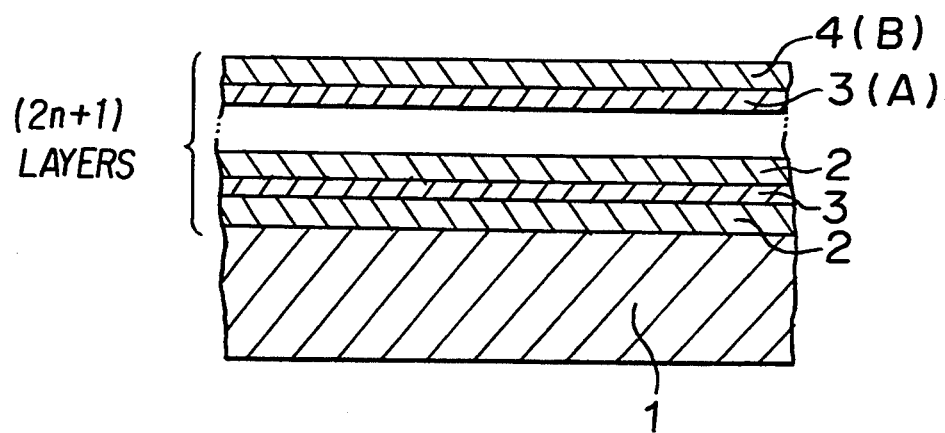

LOW EMISSIVITY FILM

This invention relates to a low emissivity film which is excellent in durability, especially in moisture resistance or in acid resistance.

A film composed of (2n+1) layers (n≧1) such as a film composed of three layers in which an oxide film, an Ag film, and an oxide film are successively coated on a surface of a substrate, or a film composed of five layers in which an oxide film, an Ag film, an oxide film, an Ag film, and an oxide film are successively coated on a surface of a substrate, is a heat reflective film called Low-E (Low-Emissivity) film. A glass in which such a Low-E film is formed, is called a Low-E glass. This glass can prevent lowering of room temperature by reflecting the thermal infrared radiation emitted from within the heated room, it being used mainly in cold district on the climates for a decreasing heating load. Furthermore, since this glass has a heat insulating effect of solar radiation energy, it can be used in a windshield of an automobile. Since this glass is transparent and is electrically conductive, it has a use as an electromagnetic shielding glass. When this glass is equipped with an electric heating such as a bus bar composed of an electrically conductive printing or the like, this glass can be used as an electrically heated window.

As a major Low-E glass, such a glass is exemplified by having a film composition of ZnO/Ag/ZnO/glass. However, since this film is devoid of durability such as anti-scratching property or chemical stability, it can not be used on a single plate, and it is necessary to use the film in a laminated glass or in double glazing. This film has a problem especially in moisture resistance, in which white dot or white turbidity is caused by moisture in the air or by moisture contained in an intermediate film in case of the laminated glass. Furthermore, since ZnO is insufficient in acid resistance, the film may be deteriorated by acid substance in the air. Due to these shortcomings, caution is required in the storage or in the handling of the single plate.

It is an object of the present invention to provide a Low-E film capable of overcoming the above shortcomings, and excellent in durability, especially in moisture resistance or in acid resistance.

According to the first aspect of the present invention, there is provided a low emissivity film which comprises:
  a substrate; and
  a coating of oxide and metallic films alternately formed on the substrate in a total of (2n+1) layers where n is an integer being equal to or more than 1, with the innermost layer being an oxide film,
  wherein the oxide film (B) formed on the outer side of the metallic film (A) being most apart from the substrate, has an internal stress which is equal to, or less than $1.1 \times 10^{10}$ dyne/cm$^2$.

According to the second another aspect of the present invention, there is provided a low emissivity film which comprises:
  a substrate; and
  a coating of oxide and metallic films alternately formed on the substrate in a total of (2n+1) layers where n is an integer being equal to or more than 1, with the innermost layer being an oxide film,
  wherein the oxide film (B) formed on the outer side of the metallic film (A) being mostly apart from the substrate, is a single layer film or a multi-layer film having at least a film whose major component is hexagonal zinc oxide; and
  a value of a diffraction angle 2θ (center of gravity position) of (002) diffraction line of the hexagonal zinc oxide of the low emissivity film in X-ray diffraction method using CuKα radiation is not smaller than 33.88° and not larger than 35.00°.

According to the third aspect of the present invention, there is provided a low emissivity film which comprises:
  a substrate; and
  a coating of oxide and metallic films alternately formed on the substrate in a total of (2n+1) layers where n is an integer being equal to or more than 1, with the innermost layer being an oxide film,
  wherein the oxide film (B) formed on the outer side of the metallic film (A) being most apart from the substrate, is a multi-layer film having at least a layer whose major component is zinc oxide and a layer whose major component is tin oxide.

In the drawings:

FIGS. 1a and 1b are sectional diagrams showing embodiments of Low-E glasses on which low emissivity. The oxide film (B) according to the first and second aspects of the invention re as follows.

As mentioned above, in case of the conventional Low-E glass (film composition: ZnO/Ag/ZnO/glass), when it is left in a room, white turbidity or white dot appears on the film due to the moisture in the air.

When the film with white turbidity or white dot is observed by a scanning electron microscope (SEM), the existence of cracks or wrinkles, and exfoliation of the film are recognized on the surface of the film.

When an elementary analysis is performed on the exfoliated part of this film, with respect to Ag and Zn, Ag is found to exist in a certain amount irrespective of the existence of the exfoliation. On the contrary, the detected amount of Zn is halved at the exfoliated part. Accordingly, the exfoliation is found to take place on the interface between the uppermost layer of ZnO and the Ag layer.

Samples before and after a moisture resistance test (the samples are left for 6 days, at 50° C., in an atmosphere of relative humidity of 95%) were examined by an X-ray diffraction method. The diffraction angle 2θ (center of gravity position of peak), interplanar spacing d, and the peak width (integral width) I.W. with respect to (002) diffraction line of hexagonal zinc oxide, and (111) diffraction line of cubic Ag, are respectively shown in Table 1.

It is possible to detect the degree of strain of the lattice due to an internal stress, by the deviation of peaks in the X-ray diffraction method. In case of the sample of ZnO(b)/Ag/ZnO(a)/glass, the peak of ZnO(b) of the uppermost layer, is detected with an intensity 5 to 15 times as much as the peak of ZnO(a). Therefore, the peak of ZnO by the X-ray diffraction method with respect to the total of the sample, is considered to be the peak of hexagonal ZnO(b) of the uppermost layer, although ZnO(a) may more or less influence it.

TABLE 1

|  | ZnO (002) | | Ag (111) | |
| --- | --- | --- | --- | --- |
|  | Before moisture resistance test | After moisture resistance test | Before moisture resistance test | After moisture resistance test |
| 2θ (deg.) | 33.78 | 33.91 | 38.09 | 38.09 |

TABLE 1-continued

|  | ZnO (002) | | Ag (111) | |
| --- | --- | --- | --- | --- |
|  | Before moisture resistance test | After moisture resistance test | Before moisture resistance test | After moisture resistance test |
| d (Å) | 2.650 | 2.641 | 2.361 | 2.361 |
| 1 · w (deg.) | 0.510 | 0.623 | 0.977 | 0.675 |

According to Table 1, (002) diffraction line of ZnO in the Low-E film before the moisture resistance test, deviates in its position, compared with $2\theta = 34.44°$ of ZnO powder. This suggests the existence of a lattice strain. This lattice strain is due to an internal stress of the film. In the samples before the moisture resistance test, the interplanar space $d_{002} = 2.650$ Å, which is larger than $d_{002} = 2.602$ Å of ZnO powder by 1.8%. From this result, the film is found to receive a considerably large compressive stress. In case of samples after the moisture resistance test, the lattice strain is more or less decreased, as $d_{002} = 2.641$ Å. This test result corresponds with the fact in which the internal stress of ZnO at the uppermost layer is partly relieved by the cracks, the wrinkles, and the exfoliation.

Concerning the (111) diffraction line of Ag, the peak width after the moisture resistance test is decreased. Therefore grain growth of Ag is considered to take place by performing the moisture resistance test.

Accordingly, mechanism of generation of the white turbidity or white dots, is considered as follows. The hexagonal ZnO film at the uppermost layer can not resist the large internal stress. The film is exfoliated from the interface with Ag film, and is destroyed. Next grain size of Ag is increased. The film displays white turbidity or white dot since light is scattered by the destroyed surface and by the large silver grain. In the examples of Table 1, the internal stress is a compressive stress. However there are two kinds of internal stress, that is, a compressive stress and the tensile stress, both of which cause destruction of the film.

From the above observation, in this invention, it is found that the decrease of the internal stress of ZnO film at the upper most layer, is effective to prevent the white turbidity or white dots due to moisture.

FIGS. 1a and 1b are sectional diagrams showing embodiments of low emissivity films according to the present invention. FIG. 1a is a sectional diagram of the low emissivity film composed of three layers, and FIG. 1b is a sectional diagram of the low emissivity film composed of (2n+1) layers. Reference numeral 1 designates a substrate, 2, an oxide film, 3, a metallic film, and 4, an oxide film (B) having low internal stress.

As a substrate 1 in this invention, a film or a plate substrate made of plastic or the like can be used as well as a glass plate.

The oxide film (B) can be used, so long as the internal stress is equal to or less than $1.1 \times 10^{10}$ dyne/cm$^2$, and is not particularly restricted. The internal stress of the film depends considerably on the deposition condition of the film. The deposition condition is necessary to be controlled precisely, when a film of low internal stress, is formed. As a method in which a tendency of decreasing internal stress of the film is shown, a method of changing the deposition condition (especially depositing by a sputtering method), such as, increasing the pressure of the atmosphere in deposition of the film (sputtering pressure), or heating the substrate in depositing the film, and a method in which a heat treatment is performed after depositing the film, are suggested. By these methods, the internal stress of the film can be decreased. The respective specific conditions can be chosen depending upon each apparatus for depositing the film, and are not particularly restricted.

No particular restriction is made on the material of the film of the oxide film (B). The film may be of a single layer, or of a multi-layer. For instance, in case of the laminated glass, there is a case in which an oxide film, such as chromium oxide, having a thickness being equal to or less than 100 Å, is formed as the outermost layer in contact with a plastic intermediate film for lamination with another substrate, for the purpose of controlling the adhesive strength with the plastic intermediate film, or for increasing the durability. The film may be composed of at least two layers including such layer.

No restriction is especially required for a specific film which comprises the oxide film (B). For instance, a film whose major component is ZnO, a film whose major component is SnO$_2$, a film whose major component is TiO$_2$, and a multi-layer film which contains at least two of the above layers, can be used. When other elements whose ionic radii are smaller than those of Zn$^{2+}$ in oxidized states are added to these films, there is a tendency of decreasing the internal stress of the film, although there may a considerable variation depending on the condition of film deposition.

Especially, concerning ZnO film comprised in the oxide film (B), as mentioned above, the internal stress of the zinc oxide film almost corresponds to the diffraction angle $2\theta$ (center of gravity position) in X-ray diffraction method. The crystal structure of a film whose major component is zinc oxide is hexagonal. To enhance the durability of the Low-E film of this invention, the range of the diffraction angle $2\theta$ (center of gravity position) of (002) diffraction line of the hexagonal zinc oxide in X-ray diffraction method using CuK$\alpha$ radiation of the Low-E film, is desirable to be from 33.88° to 35.00°, particularly, from 34.00° to 34.88°. The value of the diffraction angle $2\theta$ of 34.44° at most, corresponds with the compressive stress, and the value of 34.44° at least, with the tensile stress.

When other elements whose ionic radii are smaller than those of Zn$^{2+}$ in oxidized states are added (doped) in the ZnO film, there is a tendency of decreasing the internal stress, although depending on the condition of film deposition. A film whose major component is ZnO, doped with at least one metal selected from the group consisting of Al, Si, B, Ti, Sn, Mg, and Cr can be used in the same way as a ZnO film. Since the effect of decreasing the internal stress remains almost unchanged, when at least one of Al, Si, B, Ti, Sn, Mg, and Cr, are added in an amount of more than 10% atomic ratio, of the total amount including Zn, it is sufficient to add these elements by most at 10% . Concerning the ZnO film doped with the other elements, the same reasoning is applicable as in ZnO film, with respect to the deviation of diffraction angle $2\theta$ (center of gravity position) of (002) diffraction line of hexagonal zinc oxide.

The film thickness of the oxide film (B), although not especially restricted, is desirable to be within the range of 200 to 700 Å, considering a color tone on the total of the Low-E film, and a visible light transmittance thereof.

When the oxide film (B) is deposited by reactive sputtering in an oxygen-containing atmosphere, it is preferable to first deposit a thin metal layer in a non-oxidation atmosphere on the metallic film (A), in order to prevent the oxidation of the metallic film (A). The thin metal layer is oxidized to be an oxide layer during the deposition of the oxide film (B). Therefore the above preferable thickness of the oxide film (B) includes the thickness of the oxide layer formed by the oxidation of said thin metal layer.

As an oxide film (B), a multi-layer film can be used, having a composition of at least two layers by combining films of high internal stress and those of low internal stress. As a film of low internal stress, although depending on the condition of the film deposition, $SnO_2$ film is suggested because a $SnO_2$ film of comparatively low internal stress of $7.0 \times 10^9$ dyne/cm$^2$ at most, is relatively easy to deposit. As specific examples, three layer series such as $ZnO/SnO_2/ZnO$, or $SnO_2/ZnO/SnO_2$, or five layer series such as $ZnO/SnO_2/ZnO/SnO_2/ZnO$, or $SnO_2/ZnO/SnO_2/ZnO/SnO_2$, are suggested in which ZnO films and $SnO_2$ films are alternatively coated. The internal stress of the total of the oxide film (B) having these multi-layer films, may be $1.1 \times 10^{10}$ dyne/cm$^2$ at most, and the diffraction angle of ZnO (002) of the X-ray diffraction is not necessary to be the above value. Of course it is desirable that the ZnO film has low internal stress, and diffraction angle of ZnO (002) in X-ray diffraction method is within the above range.

In case of a multi-layer film which is composed of at least two layers by combining films of high internal stress and those of low internal stress, as an oxide film (B), as shown in the above, the number of layers and the film thickness of a layer, may be chosen depending on an apparatus, and is not especially restricted, so long as the total thickness is within the range of 200 to 700 Å. Moreover, the film thickness of each layer may be different.

Table 2 shows the relationship among the internal stress of the oxide film (B), the diffraction angle $2\theta$ (center of gravity position) of (002) diffraction line of zinc oxide of a Low-E film in which the oxide film (B) is formed on Ag/ZnO/glass by a sputtering method, and the moisture resistance of the Low-E film.

bidity at adjacent to the edge of the film, and no white spot with a diameter of at least 1 mm, Δ for a sample having no turbidity at adjacent to the edge of the film, and white spot with a diameter of 1 to 2 mm, and x for a sample having white turbidity at adjacent to the edge of the film, and white spot with a diameter at least 2 mm. The doping quantities of Al, Si, B, Ti, Sn, Mg, and Cr for all the samples are 4% in atomic ratio, of the total amount including Zn. In sample 2, the pressure of the atmosphere in film deposition, is increased compared with sample 1. In sample 3, the temperature of the substrate in film forming is elevated compared with sample 1. Sample 4 is heated after film deposition. It is found from Table 2, that the moisture resistance of the Low-E film, does not depend on the material of the film, or number of layers; a single layer or multi-layer, and depends on the internal stress and the diffraction angle $2\theta$ (center of gravity position) of (002) diffraction line of ZnO.

The oxide film (B) according to the third aspect of the invention is as follows. By using a multi-layer film as the oxide film (B) composed of, at least one layer of film whose major component is zinc oxide, and one layer of film whose major component is tin oxide, a Low-E film excellent in acid resistance is realized. The tin oxide is excellent in acid resistance, and the optical property such as refractive index is almost the same with that of zinc oxide. Therefore, by replacing a portion of the zinc oxide film, with tin oxide, an oxide film (B) excellent in acid resistance can be composed, while maintaining the optical property. On the other hand, when these films are deposited by a sputtering method, especially by a direct current sputtering method, a zinc oxide film can be deposited at a higher rate than tin oxide. Therefore, the film composition and film thickness of the oxide film (B) must be determined by considering the desired acid resistance and the film forming rate.

The film thickness of the oxide film (B), although not especially restricted, is desirable to be in the range of 200 to 700 Å, considering the color tone of the total of the Low-E film, and the visible light transmittance thereof. The number of layers and the film thickness of a single layer may be chosen according to an apparatus

TABLE 2

| | | Oxide film (B) 450 Å | Oxide film (B)/Ag/ZnO/glass 450 Å   100 Å   450 Å | |
|---|---|---|---|---|
| | Material | A value of internal stress (dyne/cm$^2$) | (002) Diffraction line of ZnO Diffraction angle $2\theta$ (deg.) | Moisture resistance |
| 1 | ZnO | $1.5 \times 10^{10}$ | 33.78 | X |
| 2 | ZnO | $1.0 \times 10^{10}$ | 33.89 | Δ |
| 3 | ZnO | $6.3 \times 10^9$ | 34.10 | ○ |
| 4 | ZnO | $1.0 \times 10^9$ | 34.42 | ○ |
| 5 | Al-doped ZnO | $6.2 \times 10^9$ | 34.10 | ○ |
| 6 | B-doped ZnO | $9.5 \times 10^9$ | 33.89 | ○ |
| 7 | Si-doped ZnO | $7.8 \times 10^9$ | 33.99 | ○ |
| 8 | Ti-doped ZnO | $4.6 \times 10^9$ | 34.21 | ○ |
| 9 | Cr-doped ZnO | $6.1 \times 10^9$ | 34.12 | ○ |
| 10 | Mg-doped ZnO | $7.9 \times 10^9$ | 33.99 | ○ |
| 11 | Sn-doped ZnO | $5.7 \times 10^9$ | 34.18 | ○ |
| 12 | ZnO/SnO$_2$/ZnO/ SnO$_2$/ZnO | $9.2 \times 10^9$ | — | ○ |

The internal stress in Table 2 is in compressive stress. The moisture resistance is evaluated by performing a test in which samples are left in an atmosphere of relative humidity of 95% at 50° C., for 6 days. In this evaluation standard, ○ is for a sample having no white turused, and are not especially restricted. Furthermore, the thickness of each layer may be different.

Zinc oxide can resist the influence of acid from the edge of the film, when the zinc oxide layer is divided to a plurality zinc oxide films, and the film thickness of the single layer of zinc oxide is made thinner. Accordingly, a specific film composition of oxide film (B), is specifically composed of a three layer series such as ZnO/SnO$_2$/ZnO, a SnO$_2$/ZnO/SnO$_2$, or five layer series such as ZnO/SnO$_2$/ZnO/SnO$_2$/ZnO, or SnO$_2$/ZnO/SnO$_2$/ZnO/SnO$_2$, and the film thickness of a single layer of zinc oxide is preferably at most 200 Å, most preferably 180 Å. More preferably, the film thickness is particularly desirable to be at most 100 Å at most, and the film is composed by the five layer series. Considering the productivity of film depositing, a multi-layer composed of the five layer series is preferred, in which the film thickness of the each layer is about 90 Å, and total thickness of the film is about 450 Å.

Such oxide film layer (B) is further preferred, when the internal stress is at most $1.1 \times 10^{10}$ dyne/cm$^2$. When the internal stress of zinc oxide is low, the film is difficult to be peeled off by the influence of acid from the edge of the film. Therefore, the low internal stress of zinc oxide is preferred also in view of the acid resistance and the moisture resistance. It is more preferable when the diffraction angle $2\theta$ (center of gravity position) of (002) diffraction line of zinc oxide by X-ray diffraction method, is within the range of 33.88° to 35.00°, particularly, from 34.00° to 34.88°.

The material of the oxide film 2 other than oxide film (B) is not especially restricted. As the oxide film 2, a film of ZnO, SnO$_2$, TiO$_2$, and a multi-layer film containing at least 2 kinds of these, and a film further added with the other elements, can be utilized. Furthermore, considering the productivity, a film in which at least two layers of ZnO, SnO$_2$, and ZnO-SnO$_2$ are alternatively laminated, and a film in which at least one of Al, Si, B, Ti, Sn, Mg, and Cr, is added in an amount of at most 10 atomic % of the total quantity including Zn, are preferred.

Considering the color tone and the visible light transmittance thereof, the thickness of the oxide film 2 is desirable to be in the range of 200 to 700 Å. In case of a multi-layer film, the total thickness may be in the range of 200 to 700 Å, and the film thickness of each layer is not restricted.

As the metallic film 3 in the present invention, a metal layer with high heat reflective function, whose major component is Ag, or Ag added with at least one of Au, Cu, and Pd, can be utilized. The metallic film 3 may also be comprised of a metal layer with various other function, other than the heat reflective metal layer (i.e. Ag layer), for example, a metal layer, such as Zn, Al, Cr, W, Ni, Ti, or alloy of these, for controlling the adhesive strength between the heat reflective metal layer and the oxide film 2 and/or the oxide film (B), or a metal layer, such as Zn, Al, Cr, W, Ni, Ti, or alloy of these, with a barrier function for preventing the diffusion of the metal from the heat reflective metal layer. Considering the balance between high heat reflective function and high visible light transmittance, the film thickness of the metallic film 3 is desirable to be in the range of 50 to 150 Å, especially about 100 Å.

Especially in case of a Low-E film of five layers such as an oxide film, a metallic film, an oxide film, a metallic film, an oxide film alternately formed, or a Low-E film of more than five layers, it is desirable to use an oxide film having an internal stress of at most $1.1 \times 10^{10}$ dyne/cm$^2$, as an oxide film 2 (an oxide film other than the oxide film (B).)

Compared with a conventional Low-E film, the moisture resistance of the Low-E film of the present invention is considerably improved in moisture resistance, by using a film of at most low internal stress of $1.1 \times 10^{10}$ dyne/cm$^2$, as an oxide film (B). This is due to the fact that the oxide film is difficult to be destroyed by the low internal stress of the oxide film, and the deterioration by moisture is prevented. Furthermore, the acid resistance is improved, by introducing a film whose major component is tin oxide in the oxide layer (B).

EXAMPLES

EXAMPLE 1

An Al doped ZnO film with a thickness of 450 Å, is deposited on a glass substrate, by a direct current sputtering method, in an atmosphere of Argon and oxygen, of Ar:O$_2$=2:8, with pressure of $6.5 \times 10^{-3}$ Torr, using a target made of metal of Al and Zn, the composition of Al being 3.0 atomic % of the total quantity including Zn. Next, an Ag film with a thickness of 100 Å is deposited in an atmosphere of only Ar with pressure of $6.5 \times 10^{-3}$ Torr, using Ag as a target. Next, an Al doped Zn film having a very thin thickness of about 20 Å, is deposited, without changing the atmosphere, using a target made of a metal of Al and Zn, the Al composition being 3.0 atomic % of the total quantity including Zn. Lastly, an Al doped ZnO film is deposited in an atmosphere of Argon and oxygen of Ar:O$_2$=2:8, with a pressure of $6.5 \times 10^{-3}$ Torr, using a target made of metal of Al and Zn, the composition of the Al being 3.0 atomic % of the total quantity including Zn. During the deposition of the Al doped ZnO film, the Al doped Zn film is oxidized in the oxygen containing atmosphere to be Al doped ZnO film. Therefore the total thickness of Al doped ZnO film deposited on the Ag film is 450 Å. The substrate temperature in depositing film is room temperature. The dc power density in depositing Al doped ZnO film, is 2.7 W/cm$^2$, and 0.7 W/cm$^2$, in depositing Ag film.

When the obtained Low-E film is checked by X-ray diffraction method, the diffraction angle $2\theta$ (center of gravity position) of (002) diffraction line of ZnO, is found to be 34.12°. The internal stress of the Al doped ZnO film (450 Å) formed under the same condition, is $6.5 \times 10^9$ dyne/cm$^2$.

The moisture resistance test is performed on the Low-E film, in which samples are left in an atmosphere of relative humidity 95% at 50° C., for 6 days. The appearance of the samples after the moisture resistance test, is favorable, in which although very small spots are observed, conspicuous white dots and white turbidity are not observed. According to a SEM photograph of the surface of the film after the moisture resistance test, almost no cracks, nor wrinkles, nor exfoliations are observed on the surface of the film.

A glass on which the above Low-E film is deposited, is laminated with another glass plate with a plastic intermediate film therebetween, disposing the Low-E film the adhesive strength being controlled inside. The same moisture test is carried out also for the laminated glass. As the result, no white turbidity nor white spot is observed on the film even after 14 days of the moisture resistance test.

EXAMPLE 2

A Low-E film is deposited, using an RF sputtering method, by successively coating ZnO film, Ag film, and Al doped ZnO film, having the film thicknesses of 450 Å, 100 Å, and 450 Å, respectively, on a glass substrate.

As a target material, ZnO, Ag, and ZnO having added $Al_2O_3$ (98 weight % ZnO, 2 weight % $Al_2O_3$), respectively, is used and a sputtering is performed in argon gas. The sputtering pressure is $1.8 \times 10^{-3}$ Torr, the substrate temperature is room temperature, and the RF power density is 3 $W/cm^2$.

When the obtained Low-E film is checked by X-ray diffraction method, the diffraction angle $2\theta$ (center of gravity position) of (002) diffraction line of ZnO, is found to be 34.00°. The internal stress of Al doped ZnO film deposited under the same condition, is $6.2 \times 10^9$ $dyne/cm^2$.

The same moisture resistance test as in Example 1 is carried out on the above film. The moisture resistance of the film is fair, in which although very small spots are observed on the film after the test, no conspicuous white turbidity nor white spot is observed.

EXAMPLE 3

A Low-E film is produced, which has a film composition of $ZnO/SnO_2/ZnO/SnO_2/ZnO/Ag/ZnO/glass$, by the same method as in Example 2. The film thickness of Ag is 100 Å, that of ZnO between Ag and glass, 450 Å, and those of ZnO layer and $SnO_2$ layer on top of Ag layer, 90 Å. ZnO layer and Ag layer are obtained by sputtering ZnO and Ag targets in Ar gas, and $SnO_2$ layer is obtained by sputtering $SnO_2$ target in an atmosphere of a mixed gas of Ar and $O_2$. The sputtering pressure, the substrate temperature, and the RF power in film deposition of ZnO and Ag are the same in the above Example 2. The power density is 1 $W/cm^2$ in film deposition of $SnO_2$, gas flow rate ratio of $Al:O_2$ is 8:2.

The internal stress of film of $ZnO/SnO_2/ZnO/SnO_2/ZnO$, formed under the same condition as above, is $9.2 \times 10^9$ $dyne/cm^2$.

The moisture resistance of the Low-E film obtained, is as favorable as in the above Example.

EXAMPLE 4

A Low-E film is produced, of which film composition is $ZnO/SnO_2/ZnO/SnO_2/ZnO/Ag/ZnO/SnO_2/ZnO/SnO_2/ZnO/glass$, by the same method as in Example 3. The thickness of Ag layer is 100 Å, those of ZnO layer and $SnO_2$ layer are 90 Å for each layer. The target, and the sputtering gas, the sputtering pressure, the substrate temperature, and RF power density, are the same as in Example 3.

The internal stress of the film of $ZnO/SnO2/ZnO/SnO2/ZnO$ produced under this condition, is $9.2 \times 10^9$ $dyne/cm^2$.

The moisture resistance of the obtained Low-E film, is as favorable as in the above Example.

EXAMPLE 5

A ZnO film, an Ag film and ZnO film, having a film thicknesses of 450 Å, 100 Å, and 450 Å, respectively, are successively formed on a glass substrate, by the same method as in Example 2. As target materials, ZnO and Ag are used, and sputterings are performed in an argon gas atmosphere. The sputtering pressure, the substrate temperature, the power density are the same as in Example 2. A heat treatment is performed on the film after the film deposition, in which samples are heated at 400° C. in $N_2$ atmosphere, for 1 hour.

When the Low-E film after the heat treatment, is checked by X-ray diffraction method, the diffraction angle $2\theta$ (center of gravity position) of (002) diffraction line of ZnO, is found to be 34.42°.

The moisture resistance of the Low-E film is as favorable as in the above Example.

COMPARATIVE EXAMPLE 1

A ZnO film, an Ag film, a ZnO film, with film thicknesses of 450 Å, 100 Å, and 450 Å, respectively, are successively coated on a glass substrate, by the same method as in the above Example 2. As for target materials, ZnO and Ag are used, and sputtering is performed in argon gas atmosphere. The sputtering pressure, the substrate temperature, and the RF power density are the same as in Example 2.

When the obtained Low-E film is checked by X-ray diffraction method, the diffraction angle $2\theta$ (center of gravity position) of (002) diffraction line of ZnO is found to be 33.78°. The internal stress of ZnO film formed under this condition, is $1.5 \times 10^{10}$ $dyne/cm^2$.

The Low-E film after the moisture resistance test, have a thin turbidity on the whole area of the surface of samples, and recognizable white spots with diameter of at least 1 mm are clearly observed.

According to the same SEM photograph after the moisture resistance test, cracks prevail on the whole area of the surface of the film, which shows considerable destruction of the film.

A glass on which the above Low-E film is deposited, is laminated with another glass plate with a plastic intermediate film therebetween, disposing the Low-E film inside. The same moisture test is carried out also for this laminated glass. As a result, clear white turbidity is observed on the edge of the film after 14 days of the moisture resistance test.

EXAMPLE 6

A Low-E film having the composition of $ZnO/SnO_2/ZnO/SnO_2/ZnO/Ag/ZnO/SnO_2/ZnO/SnO_2/ZnO/glass$, is made by using metal targets made of zinc, tin, and silver, respectively, in which the Ag film is made by a direct current sputtering method, in argon atmosphere, and the $SnO_2$ film and the ZnO film are made by a reactive direct current sputtering method in an atmosphere containing oxygen. The thickness of Ag film is 100 Å and those of ZnO film and $SnO_2$ film are 90 Å for each layer, respectively. The visible light transmittance of the glass having such Low-E film is 86%, and its emissivity is 0.06.

An acid resistance test was performed on the glass with Low-E film, in which the glass is immersed in 1N hydrochloric acid. No change is observed until 2 minutes after the immersion. However, after 3 minutes the color of the sample begins to change into brownish color from edge of the film. After 5 minutes a part of the film is observed to be exfoliated.

COMPARATIVE EXAMPLE 2

A Low-E film having the film composition of $ZnO/Ag/ZnO/glass$ is made, by using metal targets made of zinc and silver, respectively, in which the Ag film is made by a direct current sputtering method, in argon atmosphere, and the ZnO film is made by a reactive direct current sputtering method, in a atmosphere containing oxygen. The thickness of the Ag film is 100 Å, and the thickness of the ZnO film is 450 Å. The visible light transmittance of the glass having the Low-E film, is 86%, and its emissivity is 0.06.

An acid resistance test was performed on the glass with Low-E film, in which the glass is immersed in 1N hydrochloric acid. The film begins to be exfoliated just after the immersion, and after 5 minutes, the Low-E film is totally exfoliated from the glass, and vanished.

In the Low-E film of this invention, the moisture resistance and the acid resistance are significantly improved. Accordingly, the handling of the glass with such Low-E film on single plate, is likely to become easy. Furthermore, the possibility of the preservation of such glass in single plate for a long time in a room, is realized. Furthermore the reliability of the Low-E glass for an automobile or for a building, is promoted. When the film is used in a laminated glass, the glass is not deteriorated by the moisture contained in an intermediate film, which improves the durability of the laminated glass for an automobile or for a building.

The Low-E film of this invention is electrically conductive, for it is comprising the metal layer. Therefore the Low-E film of the present invention can be used in various technical fields, for example, as an electrode in electronics field (for example, solar cell), or as a heating element for electrically heated window, or as an electromagnetic shielding film for a window or for electronics use. In some cases, the Low-E film of the present invention can be applied on a substrate with various functioning layers therebetween, in which case the optical property of this Low-E film can be adjusted depending on each purpose by choosing suitable film thickness for each layer comprised in the Low-E film of the present invention.

We claim:

1. A low emissivity film which comprises:
    a substrate; and
    a coating of an oxide of zinc or tin and metallic films alternately formed on the substrate in a total of $(2n+1)$ layers where n is an integer being equal to or more than 1, with the layer closest to the substrate being an oxide film, p1 wherein the oxide film (B) formed on the outer side of the metallic film (A) being most apart from the substrate, has an internal stress which is equal to, or less than $1.1 \times 10^{10}$ dyne/cm$^2$ and is doped with at least one dopant selected from the group consisting of Al, Si, B, Ti, Sn, Mg and Cr, said oxide film (B) having a thickness of 200 to 700 Å and said metallic film having a thickness of 50 to 150 Å.

2. The low emissivity film according to claim 1, wherein at least one layer of the oxide films except the oxide film (B) has an internal stress, whose value is equal to or less than $1.1 \times 10^{10}$ dyne/cm$^2$.

3. The low emissivity film according to claim 1, wherein the oxide of the oxide film most remote from the substrate of zinc or tin is doped with at least one dopant selected from the group consisting of Al, Si, B, Ti, Sn, Mg and Cr in an amount of at most 10% atomic ratio based on the total amount of metal present.

4. The low emissivity film according to claim 1, wherein the oxide film (B) is a multi-layer film comprising at least two layers, having a film layer which has an internal stress, whose value is equal to or less than $7.0 \times 10^9$ dyne/cm$^2$ and whose major component is tin oxide.

5. The low emissivity film according to claim 4, wherein the oxide film layer (B) is a multi-layer film layer having at least a film whose major component is zinc oxide, and a film having an internal stress, whose value is equal to or less than $7.0 \times 10^9$ dyne/cm$^2$, and whose major component is tin oxide.

6. The low emissivity film according to claim 1, wherein the oxide film (B) is composed of a single layer or a multi-layer, having at least a layer of which major component is zinc oxide.

7. The low emissivity film according to claim 6, wherein the layer of said oxide film (B) most remote from the substrate comprises a layer for controlling adhesive strength thereof with a plastic intermediate film for lamination with another substrate.

8. The low emissivity film according to claim 6, wherein the crystal structure of said zinc oxide is hexagonal, and the value of the diffraction angle $2\theta$ (center of gravity position) of (002) diffraction line of the hexagonal zinc oxide in X-ray diffraction method using CuK$\alpha$ radiation, is not smaller than 33.88° and not larger than 35.00°.

9. The low emissivity film according to claim 8, wherein the value of the diffraction angle $2\theta$ (center of gravity position) of (002) diffraction line of the hexagonal zinc oxide in X-ray diffraction method using CuK$\alpha$ radiation, is not smaller than 34.00° and not larger than 34.88°.

10. A low emissivity film which comprises:
    a substrate; and
    a coating of an oxide of zinc or tin and metallic films alternately formed on the substrate in a total of $(2n+1)$ layers where n is an integer being equal to or more than 1, with a layer thereof closest to the substrate being an oxide film,
    wherein the oxide film (B) formed on the side of the metallic film (A) being most remote from the substrate, is a single layer film or a multi-layer film having at least a film whose major component is hexagonal zinc oxide and is doped with at least one dopant selected from the group consisting of Al, Si, B, Ti, Sn, Mg and Cr; and
    the value of the diffraction angle $2\theta$ (center of gravity position) or (002) diffraction line of the hexagonal zinc oxide of the low emissivity film in X-ray diffraction method using CuK$\alpha$ radiation, is not smaller than 33.88° and not larger than 35.00° wherein said oxide film (B) has a thickness of 200 to 700 Å and said metallic film has a thickness of 50 to 150 Å.

11. The low emissivity film according to claim 10, wherein the oxide of the oxide film most remote from the substrate of zinc or tin is doped with at least one dopant selected from the group consisting of Al, Si, B, Ti, Sn, Mg and Cr in an amount of at most 10% atomic ratio based on the total amount of metal present.

12. The low emissivity film according to claim 10, wherein the layer of said oxide film (B) most remote from the substrate comprises a layer for controlling adhesive strength thereof with a plastic intermediate film for lamination with another substrate.

13. The low emissivity film according to claim 10, wherein the value of the diffraction angle $2\theta$ (center of gravity position) of (002) diffraction line of the hexagonal zinc oxide in x-ray diffraction method using CuK$\alpha$ radiation is not smaller than 34.00° and not larger than 34.88°.

14. The low emissivity film according to claim 10, wherein the metallic film (A) is a metallic film whose major component is Ag.

15. A low emissivity film which comprises:
    a substrate; and
    a coating of an oxide of zinc or tin and metallic films alternately formed on the substrate in a total of $(2n+1)$ layers where n is an integer being equal to or more than 1, with the layer closest to the substrate being an oxide film, wherein the oxide film (B) formed on the side of the metallic film (a) being most remote from the substrate is a multi-layer and is doped with at least one dopant selected from the group consisting of Al, Si, B, Ti, Sn, Mg and Cr, comprising at least three layers in which a single layer or a plurality of layers, the major component thereof being zinc oxide and a single layer or a plurality of layers, the major component thereof being tin oxide, are alternatively formed, said oxide film (B) having a thickness of 200 to 700 Å and said metallic film having a thickness of 50 to 150 Å, wherein the oxide film (B) formed on the side of the metallic film (A) being most remote from the substrate has an internal stress which is equal to, or less than $1.1 \times 10^{10}$ dyne/cm$^2$.

16. The low emissivity film according to claim 15, wherein the oxide of the oxide film most remote from the substrate of zinc or tin is doped with at least one dopant selected from the group consisting of Al, Si, B, Ti, Sn, Mg and Cr in an amount of at most 10% atomic ratio based on the total amount of metal present.

17. The low emissivity film according to claim 15, wherein the crystal structure of said zinc oxide is hexagonal, and the value of the diffraction angle 2θ (center of gravity position) of (002) diffraction line of the hexagonal zinc oxide in X-ray diffraction method using CuKα radiation, is not smaller than 33.88° and not larger than 35.00°.

18. The low emissivity film according to claim 15, wherein the metallic film (A) is a metallic film whose major component is Ag.

19. The low emissivity film according to claim 15, wherein the oxide film (B) has a multi-layer film comprising three layers or five layers in which a plurality of layers, the major component thereof being zinc oxide (C), and a single layer or a plurality of layers, the major component thereof tin oxide (D), are alternatively laminated in an order of (C) layer, (D) layer, and (C) layer.

20. The low emissivity film according to claim 15, wherein the oxide film (B) has a multi-layer film comprising three layers or five layers in which a single layer or a plurality of layers whose major component is zinc oxide (E), and a plurality of layers whose major component is tin oxide (F), are alternatively laminated in an order of (F) layer, (E) layer, and (F) layer.

21. The low emissivity film according to claim 15, wherein at least one layer of the oxide films except the oxide film (B) is a multi-layer film having at least a layer whose major component is zinc oxide and a layer whose major component is tin oxide.

22. A low emissivity film which comprises:
a substrate; and
a coating of an oxide of zinc or tin and metallic films alternately formed on the substrate in a total of (2n+1) layers where n is an integer being equal to or more than 1, with the layer closest to the substrate being an oxide film, wherein the oxide film (B) being most remote from the substrate is composed of a multi-layer having at least one layer of which major component is zinc oxide, at least one of said layer whose major component is zinc oxide being doped with at least one dopant selected from the group consisting of Al, Si, B, Ti, Sn, Mg and Cr, said oxide film (B) comprising at least three layers in which a single layer or a plurality of layers, the major component thereof being zinc oxide and a single layer or a plurality of layers, the major component thereof being tin oxide, are alternatively formed, said oxide film (B) having a thickness of 200 to 700 Å and said metallic film having a thickness of 50 to 150 Å, wherein the layer of the oxide film (B) formed on the side of the metallic film (A) being most remote from the substrate whose major component is zinc oxide has an internal stress which is equal to, or less than $1.1 \times 10^{10}$ dyne/cm$^2$ and wherein the layer of said oxide film (B) most remote from the substrate comprises a layer for controlling adhesive strength thereof with a plastic intermediate film for lamination with another substrate.

* * * * *

UNITED STATES PATENT AND TRADEMARK OFFICE
CERTIFICATE OF CORRECTION

PATENT NO. : 5,413,864
DATED : MAY 9, 1995
INVENTOR(S) : MASAMI MIYAZAKI ET AL

It is certified that error appears in the above-indentified patent and that said Letters Patent is hereby corrected as shown below:

Column 2, line 24, after "ity", insert --films are formed, according to the present invention--;
       line 25, after "invention", delete "re" and replace with --are--.
Column 4, line 28, after "may", insert --be--.
Column 11, Claim 1, line 38, delete "apart", and insert --remote--;
       line 36, delete "p1".

Signed and Sealed this

Twenty-seventh Day of August, 1996

Attest:

BRUCE LEHMAN

Attesting Officer     Commissioner of Patents and Trademarks